United States Patent [19]

Goffredo et al.

[11] 4,015,706
[45] Apr. 5, 1977

[54] CONNECTING MODULES FOR AN ETCHING SYSTEM

[75] Inventors: Daniel L. Goffredo, Riverton, N.J.; Conrad Dale Shakley, Spring Mills, Pa.

[73] Assignee: Chemcut Corporation, State College, Pa.

[22] Filed: Jan. 15, 1974

[21] Appl. No.: 433,482

Related U.S. Application Data

[63] Continuation of Ser. No. 198,622, Nov. 15, 1971, abandoned.

[52] U.S. Cl. .............................. 198/780; 198/861
[51] Int. Cl.² ......................................... B65G 13/02
[58] Field of Search ......................... 198/127, 204; 74/DIG. 10; 52/753 E

[56] References Cited

UNITED STATES PATENTS

| | | | |
|---|---|---|---|
| 778,613 | 12/1904 | Ward | 198/127 R |
| 895,621 | 8/1908 | Fawell | 198/127 R |
| 2,031,054 | 2/1936 | Mc Carthy | 198/204 |
| 3,042,185 | 7/1962 | Welch | 198/204 |
| 3,082,774 | 3/1963 | Benton et al. | 198/127 R |
| 3,457,234 | 7/1969 | Gianatasio | 74/DIG. 10 |
| 3,667,589 | 6/1972 | Constable | 198/127 R |

OTHER PUBLICATIONS

R. H. Wilson and W. E. McCormick, "Toxicology of Plastics and Rubber," 11/54, pp. 479, 481.

*Primary Examiner*—Evon C. Blunk
*Assistant Examiner*—Joseph E. Valenza
*Attorney, Agent, or Firm*—Paul & Paul

[57] ABSTRACT

An etching system is disclosed, whereby individual and discrete modules are provided, each for performing its own function, with the modules being longitudinally connected in serial arrangement, and being aligned by suitable pin-in-hole arrangement, and with a common drive for all of the modules, by the use of drive rods carried by each of the modules that are coupled together with the connecton of adjacent modules. Individual features of the various drive means are also disclosed.

10 Claims, 8 Drawing Figures

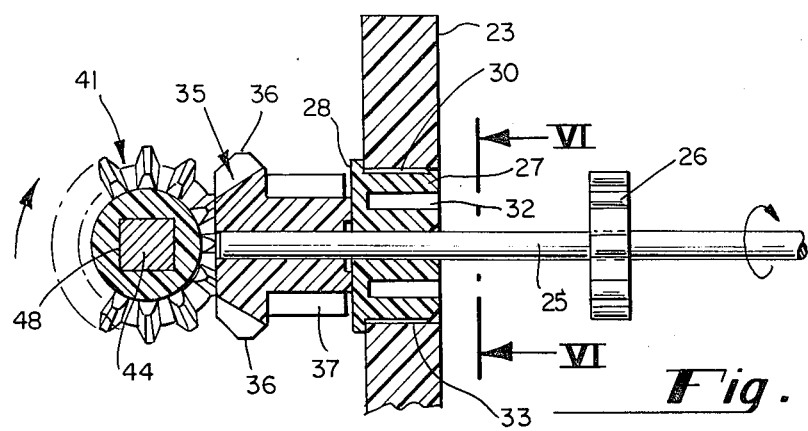
Fig. 5
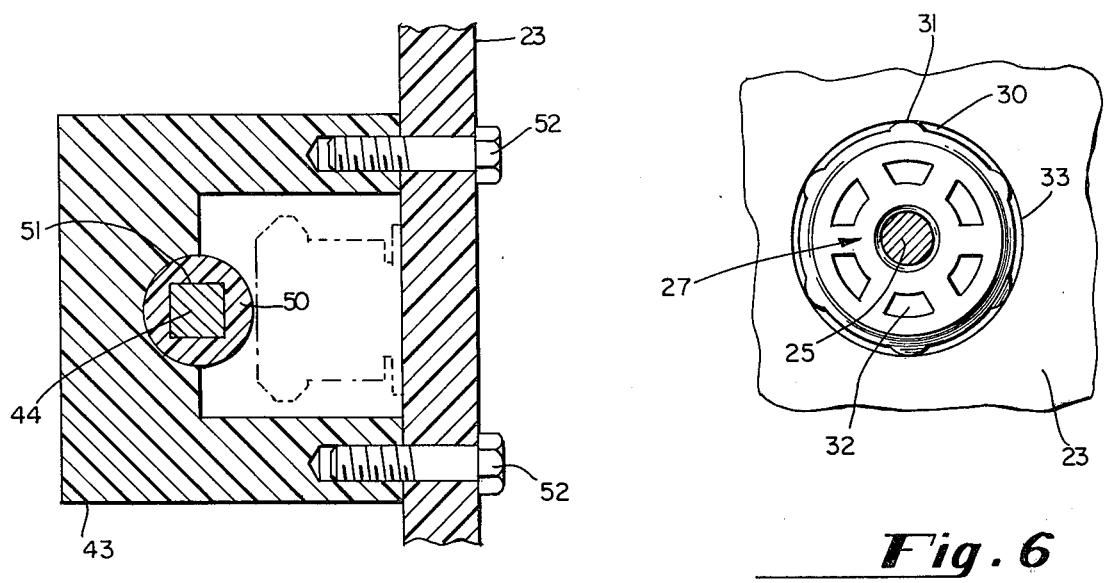
Fig. 7
Fig. 6
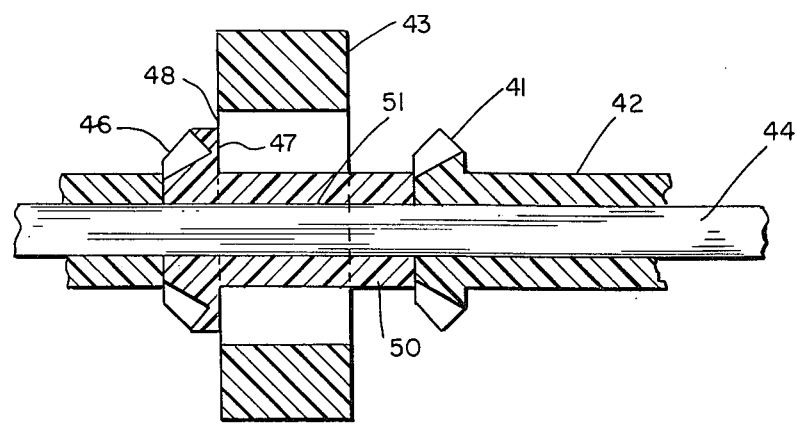
Fig. 8

4,015,706

CONNECTING MODULES FOR AN ETCHING SYSTEM

This is a continuation of application Ser. No. 198,622 filed Nov. 15, 1971 now abandoned.

BACKGROUND OF THE INVENTION

In the etching of printed circuit boards, and in the ethcing of other articles, it has been commonplace to construct an etching machine, to have a desired capacity, as well as to have desired features. For example, if rinsing stations were desired, such were introduced into the etching machine. Similarly, if drying stations were desired, such were also added to the etching apparatus. In instances in which special arrangements were desired, as for example, in which longer etching time was desired, or greater capacity, it has been known to serially dispose multiple etching machines, into a production line, one after another, in order to achieve an extension of their effective chamber length.

The present invention was developed, in order to provide a capacity for quickly and efficiently arranging and constructing an etching system, on a customized basis, by providing a desired etching capacity, a desired rinsing capacity, a desired drying capacity, etc., in the provision of modules, that may be combined in units, or in groups, to achieve a desired treatment. The modules are connected together, and are carefully aligned, and are commonly driven, with means being provided for readily connecting a drive of one module, to the drive of another.

SUMMARY OF THE INVENTION

The present invention is directed toward providing one or more modules, adapted to be connected into a line with other modules, for customized construction of an etching system, wherein the modules are each provided with a drive for facilitating the connection of the drive to a next adjacent module, and with means for facilitating the connection of the modules to a next adjacent module, as well as for facilitating its alignment therewith. Thus, the drive connection, module connection, and alignment features, separately and together, comprise the essential inventive features of this invention, with other features, such as drive details also comprising portions of the present invention.

Accordingly, it is a primary object of this invention to provide a novel module, for incorporation into an etching system, wherein the module has facility for being connected to a next adjacent module.

It is a further object of this invention, wherein such facility as discussed in the object presented immediately above, is adapted for connecting the drives of adjacent modules together.

It is a further object of this invention to provide a novel alignment device for connecting adjacent modules.

It is another object of this invention to provide a novel system for conducting an etching operation, utilizing a plurality of serially connected modules.

Other objects and advantages of the present invention will become readily apparent, to those skilled in the art from a reading of the following brief descriptions of the drawing figures, detailed description of the preferred embodiment, and the appended claims.

IN THE DRAWINGS

FIG. 4 is a perspective view of the drive arrangement illustrated in FIG. 3.

FIG. 5 is an enlarged transverse sectional view, taken through a bevel gear arrangement in accordance with this invention, generally along the line V—V of FIG. 2.

FIG. 6 is an end view of the bearing illustrated in FIG. 5, taken generally along the line VI—VI of FIG. 5.

FIG. 7 is a transverse sectional view, taken through a thrust block in accordance with this invention, generally along the line VII—VII of FIG. 2.

FIG. 8 is a longitudinal sectional view, taken through a pair of drive gears and a thrust block, generally along the line VIII—VIII of FIG. 2.

Figure 1:
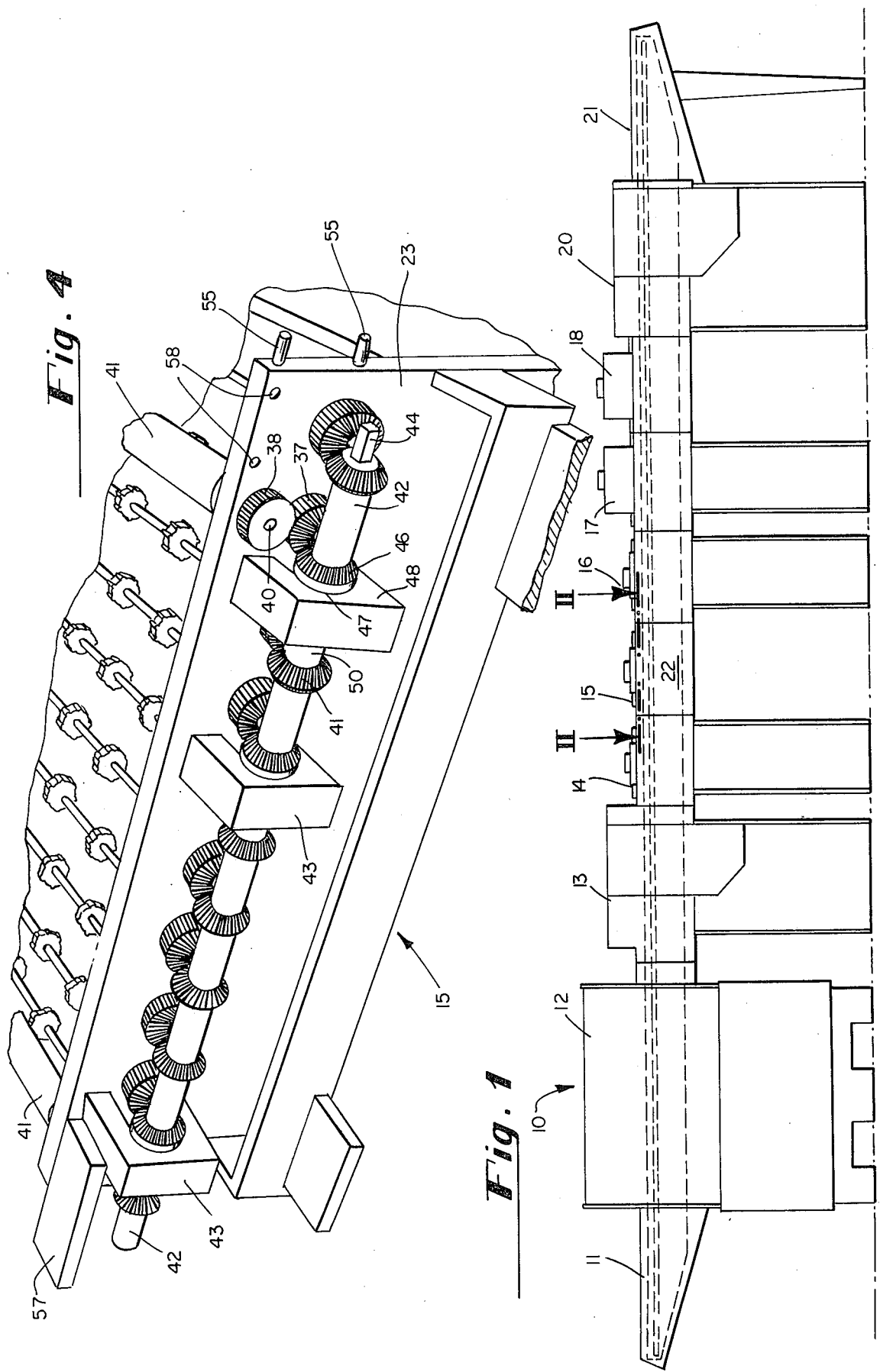
FIG. 1 is a side elevational view of an etching system, in accordance with this invention.

Referring to the drawings in detail, reference is first made to FIG. 1, wherein an etching system, generally designated by the numeral 10, is illustrated, as comprising an input conveyor module 11, an etcher module 12, a treatment fluid reclamation module 13, a recirculating rinse module 14, additional rinse modules 15 and 16, mask or resist stripping modules 17 and 18, a dryer module 20, and an output module 21. It will be noted that all of the modules 11 through 18, 20 and 21 are longitudinally arranged, serially, and that each are provided with conveying means, for conveying articles to be etched, from left to right, through the various module apparatus, as illustrated in FIG. 1.

For purposes of this particular patent application, the functions of the individual modules, insofar as they vary, from one to another are not critical, except insofar as all of modules cooperate to provide an etching system that may be designed to fulfill a wide variety of needs. Thus, it may be desired, in some instances, to utilize two or more etching chamber modules 12, or to utilize fewer rinse modules 14, 15 and 16 or more dryer modules 20, etc.

The system 10 is operated such that articles to be etched will be placed upon the input conveyor module 11, and delivered therealong, by a suitable conveyor system comprising rotating transversely disposed rods having rotating wheels mounted thereon, to be delivered to the etching module 12. It will be noted that suitable portions of the articles to be etched, for example, if they are printed circuit boards, will have previously been masked, or have a resist applied thereto, such that unmasked portions are free to be etched, whereas masked portions will not be etched, and with the unmasked portions of articles being etched by ferric chloride or other suitable etchant being applied to the articles by nozzles, jets or any other suitable etchant delivery system, within the etching chamber 12, as the articles are conveyed through the chamber 12. The articles are continuously delivered, next to the etchant reclamation apparatus 13, whereby jets of air or the like may reclaim etchant, for redelivery by any suitable means, not shown, back to the etching station or module 12. The articles are then continuously delivered, for example, to a series of rinsing modules 14, 15 and 16, whereby water or other suitable rinsing fluid may be applied to the articles, to rinse residual etchant therefrom. During the continuous delivery of the articles, they may then be delivered to a series of resist removal stations, sch as those 17 and 18, whereby the mask or resist having previously been applied to the articles, may be removed therefrom, by application of a suitable solvent or the like thereto, with the articles then being delivered to a drying station or module 20, whereby hot air or the like may be utilized to dry the articles, for delivery then to an output station or module 21. As aforesaid, any number of the above-mentioned modules may be utilized, either singly or in combination, in order to achieve the desired treatment within an etching system, or duplicates of such modules may be utilized, as desired.

All of the modules are connected together, in essentially the same manner, and by the same connection means and alignment means, as are their drive systems connected in similar manners, so that, for purposes of this invention, it will be necessary only to describe in detail the manner of connection of a given module, to its serially connected adjacent modules, it being understood that such connection is generally applicable. Also, it will be apparent that the conveying system for the etching system 10 is commonly driven, by means of a suitable electric motor or the like, connected to a drive rod (or a plurality of rods) associated with a given module only, and with all of the drive means for the various modules being driven thereby, in that such drive means are interconnected.

Figure 2:
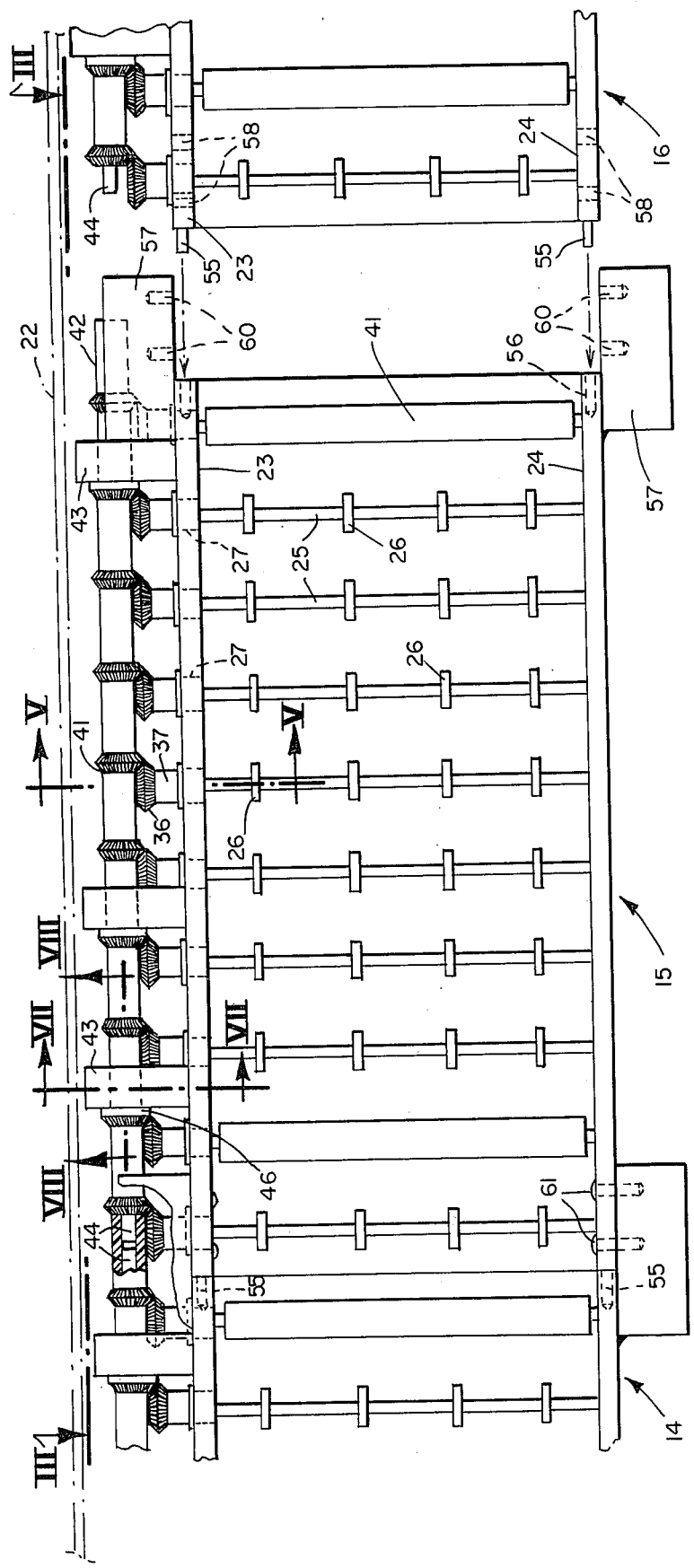
FIG. 2 is a top plan view of a module of the system illustrated in FIG. 1, taken generally along the line II—II of FIG. 1.
Figure 3:
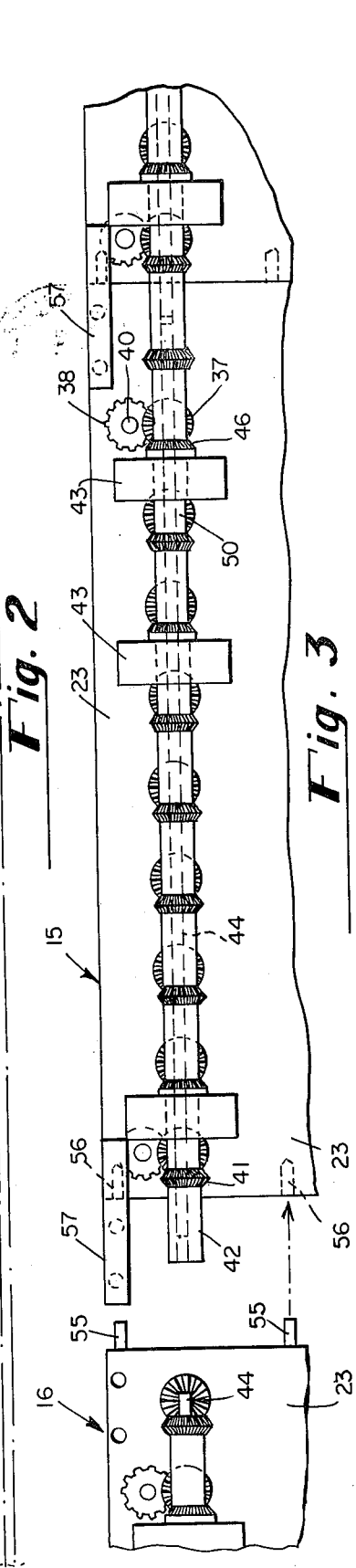
FIG. 3 is a side elevational view of the drive arrangement illustrated at the upper end of FIG. 2, taken generally along the line III—III of FIG. 2.

Accordingly, reference is next made to FIGS. 2, 3 and 4, wherein a rinsing module 15 is particularly illustrated in detail. For the sake of clarity, the module 15 is provided with a module body 22, illustrated in phantom at upper and lower ends of the illustration of FIG. 2, for the sake of clarity, in order not to obscure other features of the illustration of FIG. 2.

A pair of frame portions 23 and 24 are utilized, suitably connected to the module body 22, by means not specifically illustrated.

Extending between the frame portions 23 and 24 are provided a plurality of conveyor rods 25, having transversely spaced rotatable members 26 thereon, mounted rigidly with respect to the rods 25, for rotation therewith. The rotatable member 26 may have relieved recesses at their periphery (unnumbered), as illustrated in FIG. 5, in order to provide a more effective driving for articles being delivered thereto, and therefrom.

The ends of the rods 25 are journaled in suitable bearing members 27, generally of polyvinylchloride construction, in order to withstand an etchant such as ferric chloride or the like. Also, it will be apparent that most if not all of the members of construction within the various modules will either be of polyvinylchloride, polyethelene, or of titanium construction, for this same purpose.

The bearing member 27 is a one-piece molded member, of generally cylindrical construction, having a shoulder 28, at one end thereof, disposed against a surface of the frame member 23, and has relieved, or undercut areas 30, as illustrated in FIGS. 5 and 6, between hole-engaging portions 31, also being provided with holes 32, which cooperate with the relieved areas 30 and the areas 31, in order to provide a desired amount of resilience to the members 27, in order to facilitate their press-fit engagement within bores or holes 33 of the frame portions 23, as illustrated in FIGS. 5 and 6. This enables ready removal and replacement of the bearing members 27, as may be necessary, and also facilitates replacement of an entire drive rod 25, from time to time.

Along one side of the module 15, there is provided a bevel gear 35, fixedly mounted on the rod 25, in press-fit relation therewith, with the bevel gear 35 having a periphery 36 that is chamfered, to define, with chamfered portions 36 of all of the teeth of the gear 35, a generally right circular cylinder of revolution having an axis in line with the axis of the rod or shaft 25.

Between the toothed portion of the bevel gear 35 and the shoulder 28 of the bearing member 27, there is provided a gear-toothed periphery 37, of the spur gear type, for engagement, when desired, with another mating spur gear 38 carried at an end of a shaft 40, upon which is mounted a cylinder 41 or the like, generally at an end of a module, in order to facilitate the flattening of, or feed of an article being conveyed through the module 15, to the next adjacent module. Thus, the cylinder 41 is driven through the gears 37 and 38, from the bevel gear portion 35.

The bevel gear 35 is driven from another bevel gear 41, which is preferably integrally constructed with a suitable spacer member 42, and generally constructed of polyvinylchloride, except when such gear 41 is to be disposed against a thrust block 43, in a manner as will later be discussed herein.

It will thus be clear that the gears 35 are driven gears, in accordance with this disclosure, and the gears 41 are drive gears, in accordance with this disclosure.

The drive gears 41 are mounted on a suitable drive rod or means 44, generally of titanium construction, and of rectangular cross-section, as viewed transversely, for driving engagement with a rectangularly constructed hole 48 in the gear 41. This hole 48 of rectangular cross-sectional configuration extends through the spacer member 42, that is generally constructed to be integral with the gear 41, as aforesaid.

It will be apparent that the drive rod 44 will generally be of a single longitudinally directed member, extending substantially from one end of the module to the other, although the same could be of a plurality of rod portions 44, connected together within rectangular holes 48 of the gears 41, or spacers 48, if desired. Whether the rod 44 is constructed of a single piece, or a plurality of pieces, such will comprise drive means, in accordance with this invention.

It will genrally be desirable, in order to minimize the effect of sliding friction, to construct some of the drive gears, especially those that are to have rotating portions in engagement with nonrotating portions, to be of polyethelene construction, such as the gear 46, which has a surface 47 in engagement with a surface 48 of the thrust bearing block 43, in order to take up axial thrust throughout the entire drive arrangement for the module 15. Generally, the gear 46, along with its associated spacer 50, between itself and the next adjacent gear 41, will be of polyethelene construction, and will also have a rectangular hole, disposed therethrough, for facilitating driving engagement by a rod 44, of generally rectangular cross-sectional configuration.

It will further be noted that a gear 46 may also be utilized to drive a driven gear such as that 35, as discussed above.

The thrust blocks 43 are mounted to a frame portion 23 of the module body by suitable threaded connectors 52, as illustrated in FIG. 7, and aside from taking up longitudinally directed thrust, also serve to maintain the positioning of the drive rod 27, by maintaining the positioning of the gears 41, 46, and spacers 42, 50, carried thereon, relative to the frame portion 23.

It will thus be seen that various ones of the modules may be connected, for driving engagement of all rods 25 and rollers 41 thereof, by a common source, and that, at longitudinally spaced ends of the modules, the drive rod 44 may be connected to a drive rod 44 of a next adjacent module by a suitable gear member 41 having an integrally connected spacer member 42, connected thereto, or if desired, the spacer member 42 could be separate from the gear member 41, but in any event, will accommodate, for example, the left-most end of a drive rod 44, as illustrated in FIG. 3, and also the right-most end of a next adjacent drive rod 44, from a next adjacent unit or module, such as that 16 illustrated in FIG. 3.

Adjacent ones of the modules, such as those 15 and 16 are aligned, in order that the conveying means provided by the rotating members 26, for all of the units may have a common planar conveying surface, and also in order that the drive rods 44 therefor may be properly aligned, by the use of male and female aligning members, preferably of the dowel pin type 55, adapted for insertion into suitable blind bores, such as 56, upon movement of modules such as those 15 and 16, together. It will generally be noted that the bores 56 may be provided in one end of a frame 23, and the dowels or pins 55 may protrude from an adjacent end of an adjacent frame such as that 23 for the unit 16, as illustrated in FIG. 3. It will also be noted that a given frame may have two vertically spaced such alignment means (dowels or holes for the dowels), and that such alignment means will be provided for each of the frame portions 23 and 24, as is clearly illustrated in FIG. 2.

It will also be noted that connection blocks 57 are carried by one end of each unit, for example, the right end of the unit 15 illustrated in FIG. 2, that protrude rightwardly thereof, and are adapted to receive leftmost ends of frame portions 23 and 24 of a next adjacent unit 16 therebetween, and thereagainst, as illustrated in FIG. 2.

Left-most ends of next adjacent units, such as the unit 16, as illustrated in FIG. 2, are provided with clearance holes 58 that, when the unit 16 is aligned with the dowel pins 55 thereof disposed within the blind holes 56, such holes 58 are aligned with blind holes 60 in the blocks 57, in order to accommodate screws 61 therein, in order to securely fasten or connect adjacent modules together, such as is illustrated in FIG. 2, for connecting adjacent modules 14 and 15, together, and in order to assure proper positioning of adjacent modules relative to each other, fastened at the proper longitudinal spacing relative to each other, and in order to prevent the dowel pins 55 from working free of their holes 56.

It will thus be apparent that the alignment and the connection of adjacent modules to each other may readily be effected, in accordance with this invention, for connecting the modules themselves, and for assuring and maintaining effective connection of the drive means for the conveyor systems thereof.

It will also be apparent that the dowel pins 55 should also be of titanium construction, as should the blocks 57 be of either titanium, or of some other material construction that will resist etchants and the like.

It will further be apparent that an end module in a given system, will generally only have alignment means, connection means, and a drive member suitable for connection to an adjacent module, at one end thereof, but that modules, such as those 12 and 13 that are intermediate other modules in a system such as that illustrated in FIG. 1, will have such connection, alignment, and drive connection means at both ends.

It will also be apparent that in accordance with the invention set forth herein, several of the modules may be utilized together, without the use of an etching module as such, in a system, for example, for cleaning purposes or the like, in conjunction with systems for which etching as such is not desired, or necessary.

Furthermore, it will be understood that the term "etching" is intended in its broad sense, to encompass not only the removal of metal, but the selective removal of a substrate material, whether such material is metallic or nonmetallic (for example polymeric or the like). Other types of systems falling within such a definition of "etching", may include development processes, as for example, in the development of photoresist material for printed circuit work, and for use in the graphic arts, such as in lithography, gravure printing, and photengraving.

It will further be apparent that various changes may be made in the various details of construction, as well as in the use and operation thereof, all within the spirit and scope of the invention as recited in the appended claims.

What is claimed is:

1. An apparatus of the module type for use in a modular chemical treatment system for the treatment of articles as part of an overall etching or other chemical treatment operation that utilizes a plurality of serially connected modules, the module comprising a module body, rotatably driveable conveying means for conveying articles through the module body and for defining a longitudinal path of movement of articles through the module body, drive means for said conveying means in driving engagement therewith, said drive means being disposed longitudinally of one side of said module and including drive rod means of substantially the length of said module in the longitudinal direction, and drive rod coupling means at at least one end of said drive rod means for operative coupling with the drive means of another module upon serially adjacent positioning of said module relative to another module for imparting rotation from one drive rod means to an adjacent drive rod means, alignment means comprising a matable component of a male-female engagement device carried by at least said one end of said module body for transversely aligning said module rigidly with the longitudinally adjacent module, and including rigid mechanical fastening means carried by at least one end of said module body for rigid connection to an adjacent module body to be disposed thereagainst, wherein said conveying means include transversely disposed rotatable shaft members with driven gear means carried at one end thereof, along said one side of said module and with said drive means including drive gear means carried on said drive rod means in driving engagement with said driven gear means, wherein said drive gear means comprise a plurality of individual gears having gear spacer means disposed therebetween and disposed end-to-end over said drive rod means with adjacent said gears being longitudinally spaced from each other by said gear spacer means an amount corresponding to the longitudinal spacing of adjacent said driven gear means.

2. The apparatus of claim 1, wherein said driven gear means comprise bevel gears and said drive gears comprise bevel gears mounted at right angles to said driven bevel gears, with at least some of said gears being of polyvinyl chloride material construction.

3. The apparatus of claim 2, with at least one of said drive gears being of polyethelene material construction.

4. The apparatus of claim 1, including bearing block carried by said module for supporting said drive rod means, with said drive gears disposed closest adjacent said bearing blocks being of polyethelene construction and having portions in surface-to-surface engagement with associated said bearing blocks, and with said bearing blocks functioning as thrust-receiving members.

5. The apparatus of claim 1, wherein at least some of said drive gears are in integral connection with associated adjacent said gear spacer means.

6. The apparatus of claim 1, wherein said driven gear means comprise bevel gears, and said drive gears comprise bevel gears mounted at right angles to said driven bevel gears, and wherein said drive rod means is of rectangular construction in transverse cross-section, and with drive gears mounted thereon having matingly corresponding holes of rectangular cross-section for driving fit therebetween.

7. The apparatus of claim 1, wherein said driven gear means comprise bevel gears, and said drive gears comprise bevel gears mounted at right angles to said driven bevel gears, and wherein said drive rod means is of rectangular construction in transverse cross-section, and with drive gears mounted thereon having matingly corresponding holes of rectangular cross-section for driving fit therebetween, wherein said driven gear means comprises bevel gears, the outermost peripheries of which are chamfered to collectively define a generally right circular cylinder of revolution.

8. An apparatus of the module type for use in a modular chemical treatment system for the treatment of articles as part of an overall etching or other chemical treatment operation that utilizes a plurality of serially connected modules, the module comprising a module body, rotatably driveable conveying means for conveying articles through the module body and for defining a longitudinal path of movement of articles through the module body, drive means for said conveying means in driving engagement therewith, said drive means being disposed longitudinally of one side of said module and including drive rod means of substantially the length of said module in the longitudinal direction, and drive rod coupling means at at least one end of said drive rod means for operative coupling with the drive rod means of another module upon serially adjacent positioning of said module relative to another module for imparting rotation from one drive rod means to an adjacent drive rod means, alignment means comprising a matable component of a male-female engagement device carried by at least said one end of said module body for transversely aligning said module rigidly with the longitudinally adjacent module, and including rigid mechanical fastening means carried by at least said one end of said module body for rigid connection to an adjacent module body to be disposed thereagainst, wherein said conveying means include transversely disposed rotatable shaft members with driven gear means carried at one end thereof, along said one side of said module and with said drive means including drive gear means carried on said drive rod means in driving engagement with said driven gear means, wherein said shaft members are mounted at ends for rotation in said frame portions, with a bearing member carried in a said frame portion corresponding to at least one said end of a said shaft member, said bearing member having a generally cylindrical periphery for reception within a cylindrical hole of said frame portion in press-fit relation, with said periphery being relieved on its periphery and with the bearing member having voids extending therethrough, such that said relieved periphery and voids cooperate to define means facilitating resilient press-fitting engagement of said bearing member within an associated frame hole.

9. An apparatus of the module type for use in a modular chemical treatment system for the treatment of articles as part of an overall etching or other chemical treatment operation that utilizes a plurality of serially connected modules, the module comprising a module body, rotatably driveable conveying means for conveying articles through the module body and for defining a longitudinal path of movement of articles through the module body, drive means for said conveying means in driving engagement therewith, said drive means being disposed longitudinally of one side of said module and including drive rod means of substantially the length of said module in the longitudinal direction, and drive rod coupling means at at least one end of said drive rod means for operative coupling with the drive rod means of another module upon serially adjacent positioning of said module relative to another module for imparting rotation from one drive rod means to an adjacent drive rod means, alignment means comprising a matable component of a male-female engagement device carried by at least said one end of said module body for transversely aligning said module rigidly with the longitudinally adjacent module, and including rigid mechanical fastening means carried by a least said one end of said module body for rigid connection to an adjacent module body to be disposed thereagainst, including means carried by at least one end of said module body for connection to an adjacent module to be disposed thereagainst, and alignment means carried by said end of said module body for transversely aligning said module with a longitudinally adjacent module, wherein a plurality of said apparatus are provided each with drive rod means thereof coupled to a drive rod means of a next adjacent said module by a said coupling means, and with each said module being aligned with and connected to a next serially adjacent said module, by respectively associated said connection means and alignment means, wherein said conveying means include transversely disposed rotatable shaft members with driven gear means carried at one end thereof, along with one side of a said module and with with said drive means including drive gear means carried on said drive rod means in driving engagement with said driven gear means, wherein said drive gear means comprise a plurality of individual gears having gear spacer means disposed therebetween and disposed end-to-end over said drive rod means with adjacent said gears being longitudinally spaced from each other by said gear spacer means an amount corresponding to the longitudinal spacing of adjacent said driven gear means, wherein said coupling means comprises a drive gear of said drive gear means having an integrally connected said spacer means.

10. An apparatus of the module type for use in a modular chemical treatment system for the treatment of articles as part of an overall etching or other chemical treatment operation that utilizes a plurality of serially connected modules, the module comprising a module body, spaced apart frame portions along opposite sides of the module body, rotatably driveable conveyor means between said frame portions for conveying articles through the module body and for defining a longitudinal path of movement of articles through the module body, drive means for said conveying means in driving engagement therewith, said drive means being disposed longitudinally of one side of said module along a said frame portion and including drive rod means substantially the length of said module in the longitudinal direction, and drive rod coupling means at at least one end of said drive rod means for operative coupling with the drive rod means of another module upon serially adjacent positioning of said module relative to another module for imparting rotation from one drive rod means to an adjacent drive rod means, said coupling means including means for facilitating the transfer of drive rod motion of a serially adjacent module to said conveying means, alignment means comprising a matable component of a male-female engagement device carried by both said spaced apart frame portions of said end of said module body for transversely aligning said module rigidly with a longitudinally adjacent module, and including rigid mechanical fastening means separate from each said drive rod coupling means and said alignment means carried by both said spaced apart frame portions of at least one end of said module body for rigid connection to an adjacent module body to be disposed thereagainst, wherein a plurality of said apparatus are provided each with drive rod means thereof coupled to a drive rod means of a next adjacent said module by a said coupling means, and with said each said module being aligned with and connected to a next serially adjacent said module, by respectively associated said connection means and alignment means, wherein said conveying means include transversely disposed rotatable shaft members with driven gear means carried on said drive rod means in driving engagement with said driven gear means, wherein said drive gear means comprise a plurality of individual gears having gear spacer means disposed therebetween and disposed end-to-end over said drive rod means with adjacent said gears being longitudinally spaced from each other by said gear spacer means an amount corresponding to the longitudinal spacing of adjacent said drive gear means, wherein said coupling means comprises a bevel gearof said drive gear means having an integrally connected said spacer means, including bearing blocks carried by said module for supporting said drive rod means, with said drive gears disposed closest adjacent said bearing blocks being of polyethelene construction and having portions in surface-to-surface engagement with associated said bearing blocks, and with said bearing blocks functioning as thrust-receiving members, wherein at least some of said drive gears are in integral connection with associated adjacent said gear spacer means, wherein said driven gear means comprise gears mounted at right angles to said drive bevel gears, and wherein said drive rod means is of rectangular construction in transverse cross-section, and with drive gears mounted thereon having matingly corresponding holes of rectangular cross-section for driving fit therebetween, wherein said shaft members are mounted aat ends for rotation in said frame portions, with a bearing member carried in a said frame portion corresponding to at least one said end of a said shaft member, said bearing member having a generally cylindrical periphery for reception within a cylindrical hole of said frame portion in press-fit relation, with said periphery being relieved on its periphery and with the bearing member having voids extending therethrough, such that said relieved periphery and voids cooperate to define means facilitating press-fitting engagement of said bearing member within an associated frame hole, wherein said alignment means is carried at both longitudinally spaced ends of said module body, said alignment means comprising male alignment means at one said end and female alignment means at the other said end.

* * * * *